(12) United States Patent
Hayashi et al.

(10) Patent No.: US 6,265,244 B1
(45) Date of Patent: Jul. 24, 2001

(54) METHOD FOR MOUNTING SEMICONDUCTOR ELEMENTS

(75) Inventors: Eiji Hayashi; Yoshihiro Tomita, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/440,515

(22) Filed: Nov. 15, 1999

(30) Foreign Application Priority Data

Jun. 1, 1999 (JP) .................................................. 11-154182

(51) Int. Cl.$^7$ ........................... H01L 21/44; H01L 21/48; H01L 21/50
(52) U.S. Cl. .............................................. 438/106; 438/64
(58) Field of Search .................................... 438/106, 108, 438/110, 118, 119, 51, 55, 64, 715

(56) References Cited

U.S. PATENT DOCUMENTS

| | | | |
|---|---|---|---|
| 4,949,164 | * 8/1990 | Ohashi et al. | 357/82 |
| 4,996,589 | * 2/1991 | Kajiwara et al. | 357/82 |
| 5,133,403 | * 7/1992 | Yokomo et al. | 165/185 |
| 5,821,627 | * 10/1998 | Mori et al. | 257/780 |

FOREIGN PATENT DOCUMENTS

| | | |
|---|---|---|
| 2-285651 | 11/1990 | (JP) . |
| 5-190601 | 7/1993 | (JP) . |
| 6-124980 | 5/1994 | (JP) . |
| 8-222846 | 8/1996 | (JP) . |

* cited by examiner

*Primary Examiner*—David Nelms
*Assistant Examiner*—David Nhu
(74) *Attorney, Agent, or Firm*—McDermott, Will & Emery

(57) ABSTRACT

A method for mounting semiconductor elements without lowering the reliability of connection due to the residue of flux in the connection of the semiconductor elements to the wiring substrate. A part of the oxide film of a solder bump 3 can previously be broken by previously heating a semiconductor element 1 and a wiring substrate 2 to a predetermined preheating temperature, and pressure-welding the semiconductor element 1 to the wiring substrate 2. Furthermore, since the oxide film covering the surface of the solder bump 3 can be absorbed in the solder bump 3 by rhythmically moving the solder bump in a predetermined direction in the state where the solder bump is melted by heating the solder bump on the semiconductor element and the wiring substrate to a temperature above the melting point of solder, bonding can be performed without using flux. Furthermore, since the surface of the solder bump 3 formed on the semiconductor element 1 and/or the wiring substrate 2 can be prevented from oxidation, or the oxide film can be reduced by the inert gas or reducing gas 7 in the above-described air isolation box 6, the connection between the semiconductor element 1 and the wiring substrate 2 can further be stabilized.

11 Claims, 2 Drawing Sheets

X, Y : direction of rhythmically moving

7 : inert gas or reducing gas

METHOD FOR MOUNTING SEMICONDUCTOR ELEMENTS

BACKGROUND OF THE INVENTION

1. Field of the Invention

The present invention relates to a method for mounting semiconductor elements, and more particularly, to a method for mounting semiconductor elements by connecting semiconductor elements with a wiring substrate using flip-chip mounting.

2. Description of Related Art

A flip-chip bonding method, known as one of semiconductor element assembling techniques, is a method for connecting a solder bump on an electrode provided on the bottom surface of a semiconductor element with a facing solder bump on a connecting pad provided on the upper surface of a wiring substrate. Since flux was used in the conventional flip-chip bonding method, the oxide film on the surface of the solder bump was removed facilitating connection using solder. However, this method had a problem in that the flux remained as a residue after the cleaning step unless the quantity of the flux was optimized, or the cleaning step was properly controlled, and the residue of the flux interfered with the injection of the sealing resin in the following step. Furthermore, this method had another quality assurance problem in that the residue of the flux induced the occurrence of migration lowering the reliability of connection.

As described above, since flux is used in the conventional flip-chip bonding method, the method had a problem of the lowered reliability of connection due to the residue of flux remaining after the cleaning step.

SUMMARY OF THE INVENTION

In order to solve the above-described problems, an object of the present invention is to provide a method for mounting semiconductor elements without lowering the reliability of connection due to the residue of flux by using a flip-chip bonding method eliminating the use of flux for connecting the semiconductor elements with the wiring substrate.

According to a first aspect of the present invention, there is provided a method for mounting semiconductor elements comprising the steps of forming a solder bump on either semiconductor elements or a wiring substrate; heating the semiconductor elements and the wiring substrate to a predetermined preheating temperature lower than the melting point of the solder; pressure-welding the semiconductor elements on the wiring substrate via the solder bump; melting the solder bump formed on the semiconductor elements or the wiring substrate by heating the semiconductor elements to a temperature of or above the melting point of the solder in the state where the semiconductor elements have been pressure-welded on the wiring substrate; rhythmically moving the semiconductor elements periodically in either a horizontal direction or a vertical direction; and cooling the semiconductor elements to a predetermined cooling temperature lower than the melting point of the solder.

The above and other objects, effects, features and advantages of the present invention will become more apparent from the following description of the embodiments thereof taken in conjunction with the accompanying drawings.

DETAILED DESCRIPTION OF THE PREFERRED EMBODIMENTS

Figure 1A:
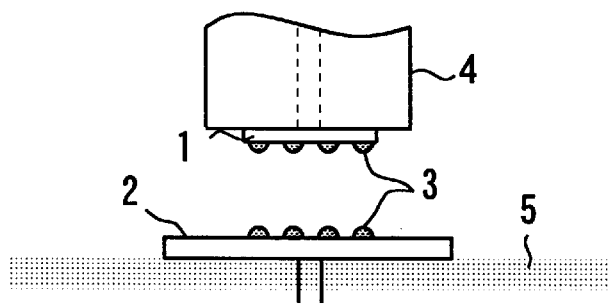
FIGS. 1(A) through 1(D) show the sectional views of the process for mounting semiconductor elements in the Embodiment 1 of the present invention.

Embodiments of the present invention will-be described below with reference to the accompanying drawings. It is noted that the same reference symbols in the drawings denote the same or corresponding components.

Embodiment 1

FIGS. 1(A) through 1(D) show the sectional views of the process for mounting semiconductor elements in the Embodiment 1 of the present invention. In FIG. 1, 1 is a semiconductor element, 2 is a wiring substrate to which the semiconductor element 1 is connected, 3 is a solder bump formed on the semiconductor element 1 of the wiring substrate 2, 4 is a bonding head for holding the semiconductor element 1, and 5 is a bonding stage for holding the wiring substrate 2.

Next, a bonding apparatus having the bonding head 4 and the bonding stage 5 will be described. As shown in FIG. 1, although a solder bump 3 is formed on each of the semiconductor element 1 and the wiring substrate 2, no flux is supplied to the solder bumps 3. The bonding head 4 can suck the semiconductor element 1 by vacuum suction, and can heat the semiconductor element 1 from room temperature to about 400° C., a temperature higher than the melting point of solder (about 180° C.). The bonding stage 5 has a built-in heater (not shown), and can previously heat the wiring substrate 2 to a pre-heating temperature close to the melting point of solder.

The method for mounting the semiconductor elements using the above-described bonding apparatus will be described. As shown in FIG. 1(A), the wiring substrate 2 is aligned to and placed on the predetermined location on the upper surface of the bonding stage 5 having been heated to a temperature close to the melting point of solder. On the other hand, the semiconductor element 1 is sucked to the bottom surface of the bonding head 4 having been heated to a predetermined preheating temperature lower than the melting point of solder. The semiconductor element 1 is positioned on the upper portion of the wiring substrate 2 in the state aligned to the predetermined location by the movement of the bonding head 4 in the horizontal direction.

Figure 1B:
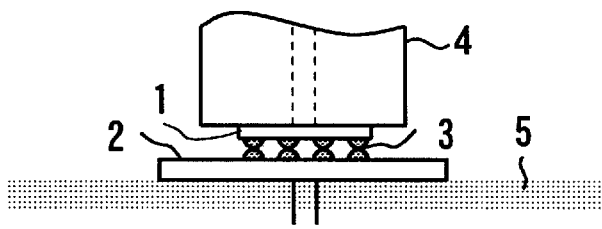

As shown in FIG. 1(B), when the bonding head 4 is descended, the semiconductor element 1 is placed on the predetermined location on the wiring substrate 2. Since the semiconductor element 1 is sucked to the bottom surface of the bonding head 4, the semiconductor element 1 is subjected to a pressure in the vertical direction for a predetermined length of time in the state aligned in the horizontal direction, and pressure-welded onto the wiring substrate 2. As a result, the contacting area of each solder bump 3 can be increased, and a part of the solder bump 3 can be broken previously.

Figure 1C:
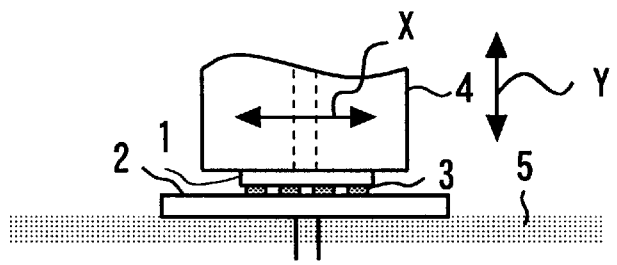

As shown in FIG. 1(C), the semiconductor element 1 is heated to a temperature above the melting point of solder in the state where the solder bump 3 formed on the semiconductor element 1 is in contact with the solder bump 3 formed on the wiring substrate 2, and is rhythmically moved (scrubbed) periodically in either horizontal direction X or vertical direction Y in the state where the solder bumps formed on the semiconductor element and the wiring substrate. As a result, the oxide film covering the surface of the solder bump 3 is absorbed in the solder bump 3, and bonding can be performed without using flux.

Figure 1D:
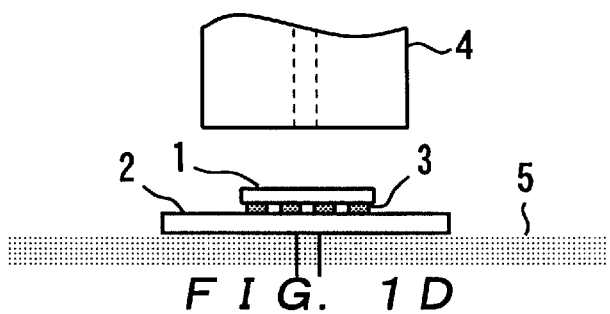

As shown in FIG. 1(D), when the bonding head 4 is cooled to a temperature lower than melting point of solder, the temperature of the semiconductor element 1 lowers, and the solder bump 3 solidifies. The suction of the semiconductor element 1 by the bonding head 4 is released and the bonding head 4 is ascended to complete bonding.

Although solder bumps 3 are formed on a semiconductor element 1 and a wiring substrate 2 in the above description, the solder bumps 3 may be formed either on the semiconductor element 1 or on the wiring substrate 2. Furthermore, the direction of the rhythmical motion is either in horizontal direction X or vertical direction Y in the above description, it may be in both horizontal direction X and vertical direction Y.

The preheating temperature of the bonding head 4 and the bonding stage is preferably about 150° C. The temperature of the bonding head 4 during rhythmic movement is preferably about 260° C., and the temperature of the bonding head 4 during cooling is preferably about 180° C. The temperature of the bonding stage 5 including that during rhythmic movement is maintained at the preheating temperature preferably at about 150° C.

According to the Embodiment 1, as described above, when the semiconductor element 1 and the wiring substrate 2 are previously heated to a predetermined preheating temperature, and the semiconductor element 1 is pressure-welded to the wiring substrate 2, a part of the oxide film of the solder bump 3 can be broken previously by pressure welding. Furthermore, since the oxide film covering the surface of the solder bump 3 can be absorbed in the solder bump 3 by rhythmically moving the semiconductor element 1 in a predetermined direction, bonding can be performed without using flux.

Embodiment 2

Figure 2:
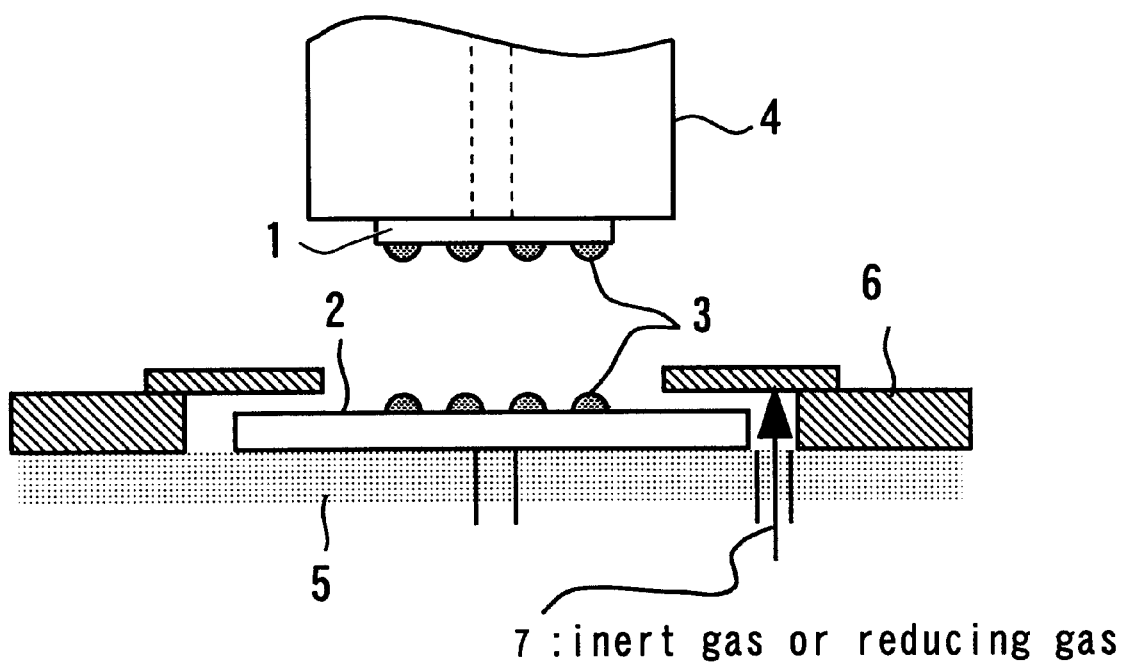
FIG. 2 shows a sectional view of the process for mounting the semiconductor element of the Embodiment 2 of the present invention.

FIG. 2 shows a sectional view of the process for mounting the semiconductor element of the Embodiment 2 of the present invention. Since components having the same symbols have the same functions, those components will not be described. In FIG. 2, 6 is an air isolation box for isolating the wiring substrate from the air, and 7 is an inert gas or reducing gas flowing in the arrow direction shown in the drawing. To the air isolation box 6 are connected the supply source (not shown) of the inert gas or reducing gas 7 and a gas heater (not shown) for heating these gases. The air isolation box 6 is always filled with the inert gas or reducing gas 7, or the mixture of these gases.

Since the surface of the solder bump 3 formed on the semiconductor element 1 and/or the wiring substrate 2 can be prevented from oxidation, or the oxide film can be reduced by the inert gas or reducing gas 7 in the above-described air isolation box 6, the connection between the semiconductor element 1 and the wiring substrate 2 can further be stabilized.

By the use of the method for mounting a semiconductor element according to the present Embodiment 2, mounting can be performed regardless of the type of the solder used in the solder bump 3. Furthermore, the wiring substrate 2 for mounting a semiconductor element can be a ceramic substrate or an organic resin substrate.

According to the Embodiment 2, as described above, since the surface of the solder bump 3 formed on the semiconductor element 1 and/or the wiring substrate 2 can be prevented from oxidation, or the oxide film can be reduced by the inert gas or reducing gas 7 in the above-described air isolation box 6, the connection between the semiconductor element 1 and the wiring substrate 2 can further be stabilized.

According to the method for mounting the semiconductor elements, as described above, there can be provided a method for mounting the semiconductor elements without lowering the reliability of connection due to the residue of flux, by the use of the flip-chip bonding method without using flux for connecting the semiconductor elements to the wiring substrate.

In the method for mounting the semiconductor elements, the steps of pressure-welding and rhythmically moving may be carried out under the solder bump is in either an inert atmosphere or a reducing atmosphere.

In the method for mounting the semiconductor elements, the step of forming a solder-bump may form a solder-bump on each of the semiconductor elements and the wiring substrate.

In the method for mounting the semiconductor elements, the step of rhythmically moving may heat the semiconductor elements to a temperature of or above the melting point of the solder in the state where the semiconductor elements have been pressure-welded on the wiring substrate, and rhythmically moves the semiconductor elements in either a horizontal direction or a vertical direction periodically in the state where the solder bump formed on the semiconductor elements or the wiring substrate has been melted.

In the method for mounting the semiconductor elements, the step of rhythmically moving may heat the wiring substrate to a temperature of or above the melting point of the solder in the state where the semiconductor elements have been pressure-welded on the wiring substrate, and rhythmically moves the semiconductor elements in either a horizontal direction or a vertical direction periodically in the state where the solder bump formed on the semiconductor elements or the wiring substrate has been melted.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 11-154182 filed on Jun. 1, 1999 including specification, claims, drawings and summary are incorporated herein by reference in its entirety.

What is claimed is:

1. A method for mounting semiconductor elements comprising the steps of:

forming a solder bump on either semiconductor elements or a wiring substrate;

heating said semiconductor elements and said wiring substrate to a predetermined preheating temperature lower than the melting point of the solder;

pressure-welding said semiconductor elements on said wiring substrate via said solder bump;

melting the solder bump formed on said semiconductor elements or said wiring substrate by heating said semiconductor elements to a temperature of or above the melting point of the solder in the state where said semiconductor elements have been pressure-welded on said wiring substrate;

rhythmically moving said semiconductor elements periodically in either a horizontal direction or a vertical direction; and cooling said semiconductor elements to a predetermined cooling temperature lower than the melting point of the solder.

2. The method for mounting the semiconductor elements according to claim 1, wherein said steps of pressure-welding and rhythmically moving are carried out under said solder bump is in either an inert atmosphere or a reducing atmosphere.

3. The method for mounting the semiconductor elements according to claim 2, wherein said step of forming a solder-bump forms a solder-bump on each of the semiconductor elements and the wiring substrate.

4. The method for mounting the semiconductor elements according to claim 3, wherein said step of rhythmically moving heats said semiconductor elements to a temperature of or above the melting point of the solder in the state where said semiconductor elements have been pressure-welded on said wiring substrate, and rhythmically moves said semiconductor elements in either a horizontal direction or a vertical direction periodically in the state where the solder bump formed on said semiconductor elements or said wiring substrate has been melted.

5. The method for mounting the semiconductor elements according to claim 4, wherein said step of rhythmically moving heats said wiring substrate to a temperature of or above the melting point of the solder in the state where said semiconductor elements have been pressure-welded on said wiring substrate, and rhythmically moves said semiconductor elements in either a horizontal direction or a vertical direction periodically in the state where the solder bump formed on said semiconductor elements or said wiring substrate has been melted.

6. The method for mounting the semiconductor elements according to claim 3, wherein said step of rhythmically moving heats said wiring substrate to a temperature of or above the melting point of the solder in the state where said semiconductor elements have been pressure-welded on said wiring substrate, and rhythmically moves said semiconductor elements in either a horizontal direction or a vertical direction periodically in the state where the solder bump formed on said semiconductor elements or said wiring substrate has been melted.

7. The method for mounting the semiconductor elements according to claim 2, wherein said step of rhythmically moving heats said semiconductor elements to a temperature of or above the melting point of the solder in the state where said semiconductor elements have been pressure-welded on said wiring substrate, and rhythmically moves said semiconductor elements in either a horizontal direction or a vertical direction periodically in the state where the solder bump formed on said semiconductor elements or said wiring substrate has been melted.

8. The method for mounting the semiconductor elements according to claim 2, wherein said step of rhythmically moving heats said wiring substrate to a temperature of or above the melting point of the solder in the state where said semiconductor elements have been pressure-welded on said wiring substrate, and rhythmically moves said semiconductor elements in either a horizontal direction or a vertical direction periodically in the state where the solder bump formed on said semiconductor elements or said wiring substrate has been melted.

9. The method for mounting the semiconductor elements according to claim 1, wherein said step of forming a solder-bump forms a solder-bump on each of the semiconductor elements and the wiring substrate.

10. The method for mounting the semiconductor elements according to claim 1, wherein said step of rhythmically moving heats said semiconductor elements to a temperature of or above the melting point of the solder in the state where said semiconductor elements have been pressure-welded on said wiring substrate, and rhythmically moves said semiconductor elements in either a horizontal direction or a vertical direction periodically in the state where the solder bump formed on said semiconductor elements or said wiring substrate has been melted.

11. The method for mounting the semiconductor elements according to claim 1, wherein said step of rhythmically moving heats said wiring substrate to a temperature of or above the melting point of the solder in the state where said semiconductor elements have been pressure-welded on said wiring substrate, and rhythmically moves said semiconductor elements in either a horizontal direction or a vertical direction periodically in the state where the solder bump formed on said semiconductor elements or said wiring substrate has been melted.

* * * * *